United States Patent
Chen et al.

(10) Patent No.: US 11,482,495 B2
(45) Date of Patent: Oct. 25, 2022

(54) SEMICONDUCTOR ARRANGEMENT AND METHOD FOR MAKING

(71) Applicant: TAIWAN SEMICONDUCTOR MANUFACTURING COMPANY LIMITED, Hsin-Chu (TW)

(72) Inventors: Pin-Wen Chen, Keelung (TW); Mei-Hui Fu, Hsinchu (TW); Hong-Mao Lee, Hsinchu (TW); Wei-Jung Lin, Hsinchu (TW); Chih-Wei Chang, Hsin-Chu (TW)

(73) Assignee: TAIWAN SEMICONDUCTOR MANUFACTURING COMPANY, ltd., Hsinchu (TW)

( * ) Notice: Subject to any disclaimer, the term of this patent is extended or adjusted under 35 U.S.C. 154(b) by 0 days.

(21) Appl. No.: 16/681,952

(22) Filed: Nov. 13, 2019

(65) Prior Publication Data
US 2020/0176382 A1   Jun. 4, 2020

Related U.S. Application Data

(60) Provisional application No. 62/773,312, filed on Nov. 30, 2018.

(51) Int. Cl.
*H01L 21/76* (2006.01)
*H01L 23/535* (2006.01)
(Continued)

(52) U.S. Cl.
CPC ...... *H01L 23/535* (2013.01); *H01L 21/76805* (2013.01); *H01L 21/76816* (2013.01);
(Continued)

(58) Field of Classification Search
CPC combination set(s) only.
See application file for complete search history.

(56) References Cited

U.S. PATENT DOCUMENTS

| 2001/0055842 A1 | 12/2001 | Uh et al. |
| 2007/0077761 A1 | 4/2007 | Lehr et al. |
| (Continued) | | |

FOREIGN PATENT DOCUMENTS

| CN | 101393904 A | 3/2009 |
| CN | 103066123 A | 4/2013 |
| (Continued) | | |

*Primary Examiner* — Moin M Rahman
(74) *Attorney, Agent, or Firm* — Cooper Legal Group, LLC

(57) ABSTRACT

A method for fabricating a semiconductor arrangement includes removing a portion of a first dielectric layer to form a first recess defined by sidewalls of the first dielectric layer, forming a first conductive layer in the first recess, removing a portion of the first conductive layer to form a second recess defined by the sidewalls of the first dielectric layer, forming a second conductive layer in the second recess, where the second conductive layer contacts the first conductive layer, forming a second dielectric layer over the second conductive layer, removing a portion of the second dielectric layer to form a third recess defined by sidewalls of the second dielectric layer, where the second conductive layer is exposed through the third recess, and forming a third conductive layer in the third recess, where the third conductive layer contacts the second conductive layer.

20 Claims, 10 Drawing Sheets

(51) Int. Cl.
*H01L 23/528* (2006.01)
*H01L 23/532* (2006.01)
*H01L 21/768* (2006.01)

(52) U.S. Cl.
CPC .... *H01L 21/76895* (2013.01); *H01L 23/5283* (2013.01); *H01L 23/53209* (2013.01); *H01L 23/53257* (2013.01)

(56) References Cited

U.S. PATENT DOCUMENTS

| | | |
|---|---|---|
| 2008/0315321 A1 | 12/2008 | Ke et al. |
| 2012/0032240 A1 | 2/2012 | Mayuzumi |
| 2013/0062772 A1 | 3/2013 | Isono |
| 2015/0270215 A1* | 9/2015 | Peng ................ H01L 21/76879 257/751 |
| 2016/0111371 A1* | 4/2016 | Peng ................ H01L 21/76831 257/751 |
| 2016/0133514 A1* | 5/2016 | Chen ................ H01L 21/76864 438/643 |
| 2019/0273047 A1* | 9/2019 | Yang ................ H01L 21/76849 |

FOREIGN PATENT DOCUMENTS

| | | |
|---|---|---|
| CN | 104934409 A | 9/2015 |
| CN | 107230702 A | 9/2015 |
| CN | 105870102 A | 8/2016 |
| JP | 2012038979 A | 2/2012 |
| KR | 20010088287 A | 9/2001 |
| KR | 20040055868 A | 6/2004 |
| KR | 20050009625 A | 1/2005 |

\* cited by examiner

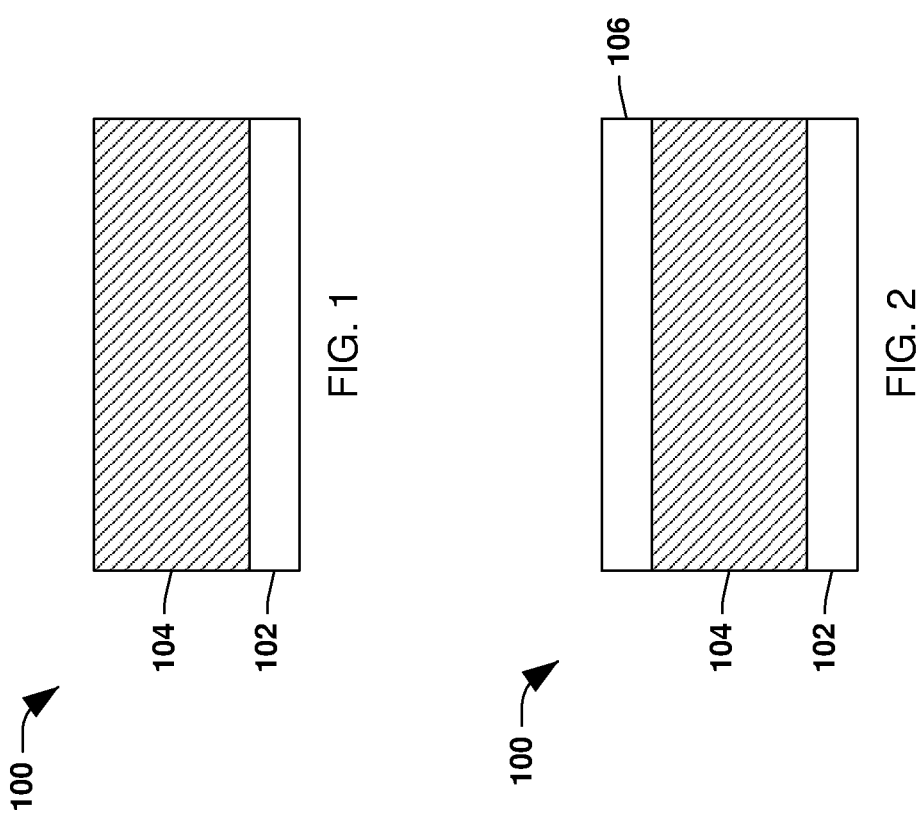

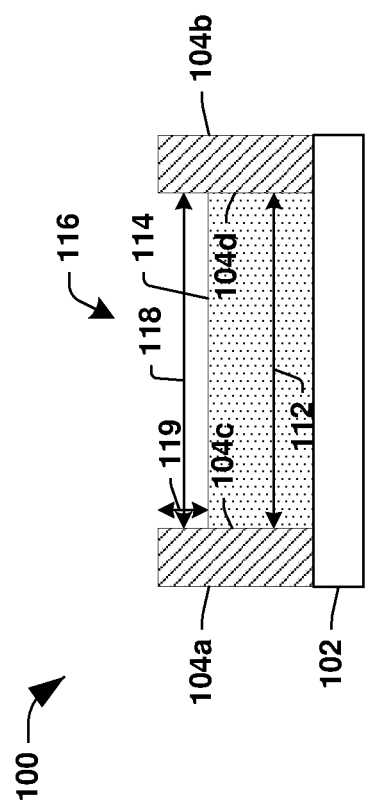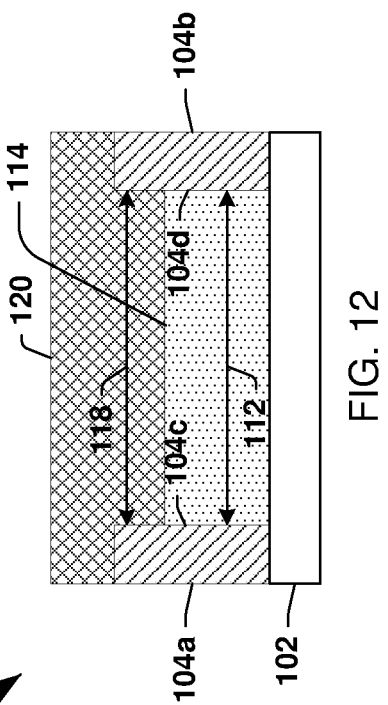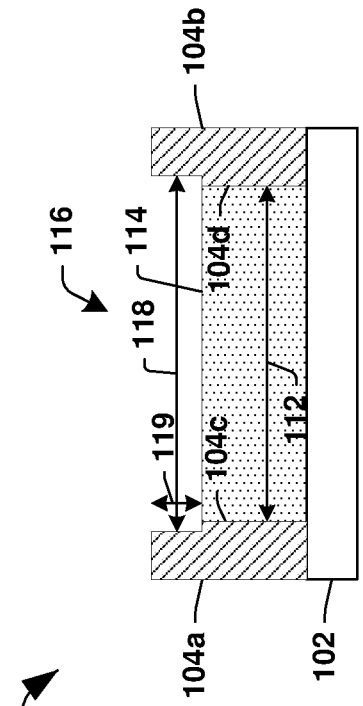
FIG. 10
FIG. 11
FIG. 12

SEMICONDUCTOR ARRANGEMENT AND METHOD FOR MAKING

RELATED APPLICATIONS

This application claims priority to U.S. Provisional Application Ser. No. 62/773,312, titled "METAL CAP FOR CONTACT" and filed on Nov. 30, 2018, which is incorporated herein by reference.

BACKGROUND

During semiconductor fabrication, different conductive layers are connected to one another to establish a semiconductor structure. One technique to connect different conductive layers is to use one or more metal contacts that connect two or more conductive layers to each other.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-22 illustrate cross-sectional views of a semiconductor arrangement at various stages of fabrication, in accordance with some embodiments.

DETAILED DESCRIPTION

Figure 3:
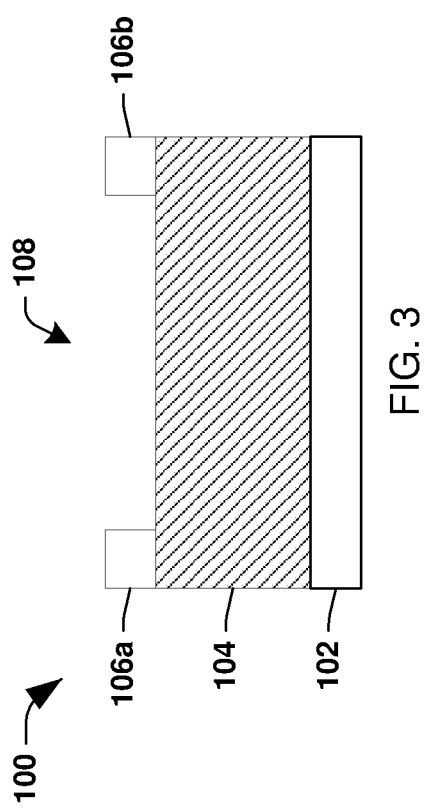

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments relate to a method for fabricating a semiconductor arrangement that includes removing a portion of a first dielectric layer to form a first recess defined by a first sidewall of the first dielectric layer and a second sidewall of the first dielectric layer, forming a first conductive layer in the first recess, removing a portion of the first conductive layer to form a second recess defined by the first sidewall of the first dielectric layer and the second sidewall of the first dielectric layer, forming a second conductive layer in the second recess, where the second conductive layer is in contact with the first conductive layer, forming a second dielectric layer over the second conductive layer, removing a portion of the second dielectric layer to form a third recess defined by a first sidewall of the second dielectric layer and a second sidewall of the second dielectric layer, where the second conductive layer is exposed through the third recess, and forming a third conductive layer in the third recess, where the third conductive layer is in contact with the second conductive layer.

According to some embodiments, removing the portion of the first dielectric layer to form the first recess results in a relatively uniform upper surface of a support medium upon which the first conductive layer is formed. According to some embodiments, a relatively uniform surface is a surface that is at least one of substantially smooth, planar, regular, or defect free. According to some embodiments, the relatively uniform upper surface of the support medium results in a relatively uniform interface between the support medium and the first conductive layer when the first conductive layer is formed over the support medium. According to some embodiments, the relatively uniform interface between the support medium and the first conductive layer results in a lower resistance with respect to the support medium and the first conductive layer as compared to layers having a less uniform interface. According to some embodiments, the relatively uniform interface between the support medium and the first conductive layer results in a lower capacitance with respect to the support medium and the first conductive layer as compared to layers having a less uniform interface. According to some embodiments, the relatively uniform interface between the support medium and the first conductive layer results in a lower RC delay with respect to the support medium and the first conductive layer as compared to layers having a less uniform interface, where RC delay is a metric for measuring delay in signal speed as a function of resistance and capacitance.

According to some embodiments, removing the portion of the first conductive layer to form the second recess results in a relatively uniform upper surface of the first conductive layer upon which the second conductive layer is formed. According to some embodiments, the relatively uniform upper surface of the first conductive layer results in a relatively uniform interface between the first conductive layer and the second conductive layer when the second conductive layer is formed over the first conductive layer. According to some embodiments, the relatively uniform interface between the first conductive layer and the second conductive layer results in a lower resistance with respect to the first conductive layer and the second conductive layer as compared to conductive layers having a less uniform interface. According to some embodiments, the relatively uniform interface between the first conductive layer and the second conductive layer results in a lower capacitance with respect to the first conductive layer and the second conductive layer as compared to conductive layers having a less uniform interface. According to some embodiments, the relatively uniform interface between the first conductive layer and the second conductive layer results in a lower RC delay with respect to the first conductive layer and the second conductive layer as compared to conductive layers having a less uniform interface.

According to some embodiments, removing the portion of the second dielectric layer to expose the second conductive layer through the third recess results in a relatively uniform upper surface of the second conductive layer upon which the third conductive layer is formed. According to some embodiments, the relatively uniform upper surface of the second conductive layer results in a relatively uniform interface between the second conductive layer and the third conductive layer when the third conductive layer is formed over the second conductive layer. According to some embodiments, the relatively uniform interface between the second conductive layer and the third conductive layer results in a lower resistance with respect to the second conductive layer and the third conductive layer as compared to conductive layers having a less uniform interface. According to some embodiments, the relatively uniform interface between the second conductive layer and the third conductive layer results in a lower capacitance with respect to the second conductive layer and the third conductive layer as compared to conductive layers having a less uniform interface. According to some embodiments, the relatively uniform interface between the second conductive layer and the third conductive layer results in a lower RC delay with respect to the second conductive layer and the third conductive layer as compared to conductive layers having a less uniform interface.

According to some embodiments, a width of the second conductive layer is greater than a width of the third conductive layer such that the third conductive layer contacts the second conductive layer but does not contact the first dielectric layer that surrounds or is adjacent to the second conductive layer. According to some embodiments, a resistance with respect to the second conductive layer and the third conductive layer is decreased where the third conductive layer contacts the second conductive layer but does not contact the first dielectric layer as compared to an arrangement where the third conductive layer contacts at least some of the first dielectric layer. According to some embodiments, a capacitance with respect to the second conductive layer and the third conductive layer is decreased where the third conductive layer contacts the second conductive layer but does not contact the first dielectric layer as compared to an arrangement where the third conductive layer contacts at least some of the first dielectric layer. According to some embodiments, an RC delay with respect to the second conductive layer and the third conductive layer is decreased where the third conductive layer contacts the second conductive layer but does not contact the first dielectric layer as compared to an arrangement where the third conductive layer contacts at least some of the first dielectric layer.

FIG. 1 illustrates a semiconductor arrangement 100 that includes a support medium 102 and a dielectric layer 104, according to some embodiments. In some embodiments, the support medium 102 functions as a foundation, base, or table to hold various layers during fabrication. In some embodiments, the support medium 102 is a substrate. According to some embodiments, the support medium 102 is made of glass. In some embodiments, the support medium 102 is transparent to light. In some embodiments, the support medium 102 is transparent to light at ultraviolet (UV) wavelengths. In some embodiments, the support medium 102 is a p-type semiconductor substrate (P-substrate). In some embodiments, the support medium 102 is an n-type semiconductor substrate (N-substrate). In some embodiments, the support medium 102 comprises at least one of silicon, germanium, carbide, arsenide, gallium, arsenic, phosphide, indium, antimonide, SiGe, SiC, GaAs, GaP, InP, InAs, InSb, GaAsP, AlInAs, AlGaAs, GaInAs, GaInP, GaInAsP, or other suitable materials. In some embodiments, the support medium 102 comprises at least one doped region. According to some embodiments, the support medium 102 comprises at least one of an epitaxial layer, a silicon-on-insulator (SOI) structure, a wafer, or a die formed from a wafer.

The dielectric layer 104 is formed over the support medium 102, according to some embodiments. In some embodiments, the dielectric layer 104 is in contact with a top surface of the support medium 102. In some embodiments, the dielectric layer 104 comprises at least one of a polymer, an oxide, polybenzobisoxazole (PBO), a polyimide (PI), a metal nitride, silicon, germanium, carbide, gallium, arsenide, germanium, arsenic, indium, silicon oxide, sapphire, a buried oxide (BOX) layer, a high-k dielectric constant material, a rare earth oxide, an aluminate of a rare earth oxide, a silicate of a rare earth oxide, an epitaxial layer, a SOI structure, a wafer, a die formed from a wafer, a doped epitaxial layer, a semiconductor layer, a gradient semiconductor layer, a plurality of semiconductor layers, a plurality of semiconductor layers where one or more of the semiconductor layers are of a different type than another layer of the plurality of semiconductor layers, or other suitable materials. In some embodiments, the dielectric layer 104 is formed by at least one of physical vapor deposition (PVD), sputtering, chemical vapor deposition (CVD), low pressure CVD (LPCVD), atomic layer deposition (ALD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), spin coating, oxidation, or other suitable techniques.

FIG. 2 illustrates a photoresist 106 formed over the dielectric layer 104, according to some embodiments. In some embodiments, the photoresist 106 is formed by at least one of spinning, spray coating, or other applicable processes.

FIG. 3 illustrates the photoresist 106 patterned to have an opening 108 defined by a sidewall of a first portion 106a of the photoresist and a sidewall of a second portion 106b of the photoresist, according to some embodiments. In some embodiments, the photoresist 106 comprises a light-sensitive material, where properties, such as solubility, of the photoresist 106 are affected by light. The photoresist 106 is either a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative of a pattern defined by opaque regions of a template between the light source and the negative photoresist. In a positive photoresist, illuminated regions of the positive photoresist become soluble and are removed via application of a solvent during development. Thus, a pattern formed in the positive photoresist is a positive image of opaque regions of the template between the light source and the positive photoresist.

Figure 4:
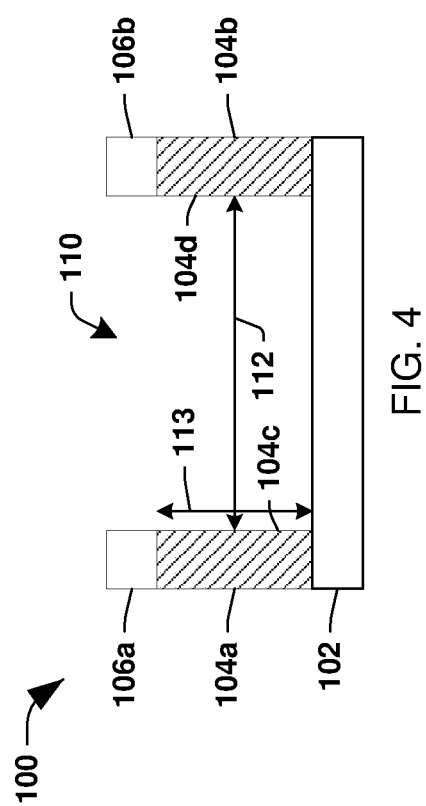

FIG. 4 illustrates use of the patterned photoresist 106 in removing a portion of the dielectric layer 104 to form a recess 110 defined by a first sidewall 104c of a first portion 104a of the dielectric layer 104 and a second sidewall 104d of a second portion 104b of the dielectric layer 104, according to some embodiments. In some embodiments, an etching process is performed to form the recess 110, where the first portion 106a of the photoresist 106 protects or shields the first portion 104a of the dielectric layer 104 from an etchant applied during the etching process and the second portion 106b of the photoresist 106 protects or shields the second portion 104b of the dielectric layer 104 from the etchant applied during the etching process. A portion of the dielectric layer 104 not covered by the photoresist 106 is exposed to the etchant and is removed or etched away during the etching process to expose a portion of the support medium 102. In some of embodiments, the dielectric layer 104 is not etched all the way through such that the support medium 102 is not exposed through the recess 110.

The recess 110 has a width 112 defined by a distance between the first sidewall 104c of the first portion 104a of the dielectric layer 104 and the second sidewall 104d of the second portion 104b of the dielectric layer 104, in some embodiments. According to some embodiments, the width 112 is substantially constant, such as where the first sidewall 104c and the second sidewall 104d are substantially planar and parallel to one another. According to some embodiments, the recess 110 extends downwards to the top surface of the support medium 102. In some embodiments, the recess 110 extends only a portion of the way towards the support medium 102 such that the support medium 102 is not exposed through the recess 110. The recess 110 has a depth 113 defined by a distance between the top surface of the support medium 102 and the top surface of the dielectric layer 104, according to some embodiments. In some embodiments, a ratio of the depth 113 to the width 112 of the recess 110 is between 0.25 and 7.5 indicating that the recess is sufficiently deep so that a feature formed in the recess 110 is seated in the recess and unlikely to easily dislodge from the recess 110. In some embodiments, a ratio of the depth 113 to the width 112 of the recess 110 is less than 7.5 indicating that the recess is sufficiently deep so that a feature formed in the recess 110 is seated in the recess and unlikely to easily dislodge from the recess 110. According to some embodiments, the etching process is a wet etching process. According to some embodiments, the etching process is a dry etching process. According to some embodiments, the etching process uses at least one of hydrogen chloride (HCl$_2$), hydrogen sulfide (H$_2$S), or other suitable materials. According to some embodiments, the top surface of the support medium 102 is relatively uniform after the recess 110 is formed. In some embodiments, an etch selectivity of at least one of the support medium 102, the dielectric layer 104, or the photoresist 106 relative to an etchant of the etching process yields the relatively uniform top surface of the support medium 102. In some embodiments, a relatively uniform surface is substantially planar such that few to no portions of the surface do not lie within a same plane. In some embodiments, at least one of time, temperature, pressure, etchant(s) utilized, or other variables are controlled to control removal of the portion of the dielectric layer 104. In some embodiments, one or more variables are controlled to promote substantially vertical, as opposed to lateral, removal of the dielectric layer 104 so that at least one of the first sidewall 104c and the second sidewall 104d are substantially planar or the respective thicknesses of the first portion 104a of the dielectric layer 104 and the second portion 104b of the dielectric layer 104 experience little to no alteration when the portion of the dielectric layer 104 is removed. In some embodiments, one or more etchants remove the dielectric layer 104 at a substantially uniform rate such that as the thickness of the dielectric layer 104 is reduced between the first portion 104a and the second portion 104b the thickness of the dielectric layer 104 nevertheless remains substantially constant between the first portion 104a and the second portion 104b. In some embodiments, the thickness of the dielectric layer 104 is measured from the top surface of the support medium 102 to the top surface of the dielectric layer. In some embodiments, the thickness of the dielectric layer 104 is measured from a bottom surface of the dielectric layer 104 to the top surface of the dielectric layer 104. In some embodiments, given a substantially uniform removal rate of the dielectric layer 104, generally no portion of the top surface of the support medium 102 is exposed before any other portion of the top surface of the support medium 102 is exposed. In some embodiments, substantially uniform exposure of the top surface of the support medium 102 yields the relatively uniform top surface of the support medium 102 at least because no portion of the top surface of the support medium 102 is exposed to an etchant longer than any other portion of the top surface of the support medium 102. In some embodiments, one or more variables are controlled to promote the substantially uniform removal rate of the dielectric layer 104, and thereby yield the relatively uniform top surface of the support medium 102 as compared to scenarios where such variables are not so controlled.

Figure 5:
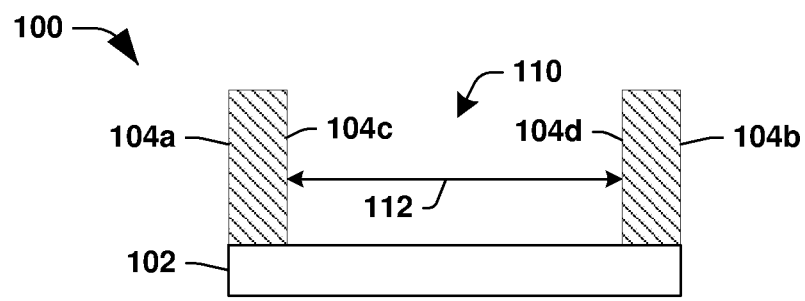

FIG. 5 illustrates the first portion 106a of the photoresist and the second portion 106b of the photoresist washed away, stripped, or otherwise removed, according to some embodiments.

Figure 6:
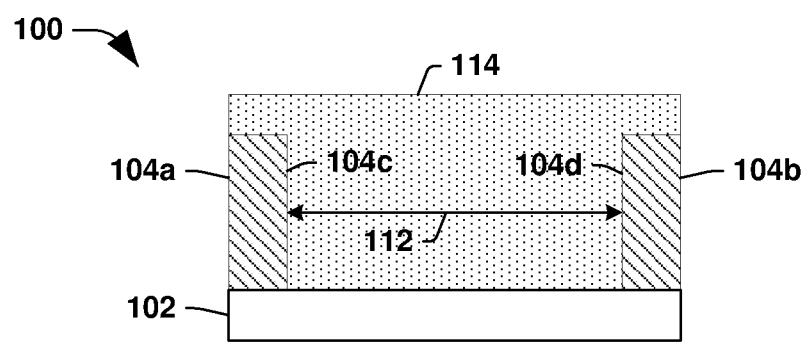

FIG. 6 illustrates a first conductive layer 114 formed in the recess 110 and over the first sidewall 104c and the second sidewall 104d, according to some embodiments. In some embodiments, the first conductive layer 114 comprises a metal material for the conduction of electricity. According to some embodiments, the first conductive layer 114 comprises metal. According to some embodiments, the first conductive layer 114 is electrically conductive. According to some embodiments, the first conductive layer 114 comprises metal but has little to no electrical conductivity. According to some embodiments, the first conductive layer 114 comprises at least one of cobalt, tungsten, carbide, titanium (Ti), titanium nitride (TiN), tantalum (Ta), tantalum nitride (TaN), or other suitable materials. In some embodiments, the first conductive layer 114 is formed by at least one of physical vapor deposition (PVD), sputtering, chemical vapor deposition (CVD), low pressure CVD (LPCVD), atomic layer deposition (ALD), atomic layer chemical vapor deposition (AL-CVD), ultrahigh vacuum CVD (UHVCVD), reduced pressure CVD (RPCVD), molecular beam epitaxy (MBE), liquid phase epitaxy (LPE), spin coating, oxidation, or other suitable techniques.

In some embodiments, forming the first conductive layer 114 comprises forming a seed layer (not shown) over at least one of the first sidewall 104c, the second sidewall 104d, or a top surface of a feature that defines a bottom of the recess 110, such as a top surface of the support medium 102. In some embodiments, the seed layer comprises at least one of copper, titanium, or other suitable materials. In some embodiments, the seed layer facilitates growing the first conductive layer 114 in the recess 110.

In some embodiments, the first conductive layer 114 serves as a metal contact that facilitates electrical connection to one or more conductive layers at least one of above or below the first conductive layer 114, such as one or more conductive layers in the support medium 102. In some embodiments, the first conductive layer 114 serves as a capacitor bottom metal (CBM) electrode. In some embodiments, the first conductive layer 114 has a width that corresponds to the width 112.

Figure 7:
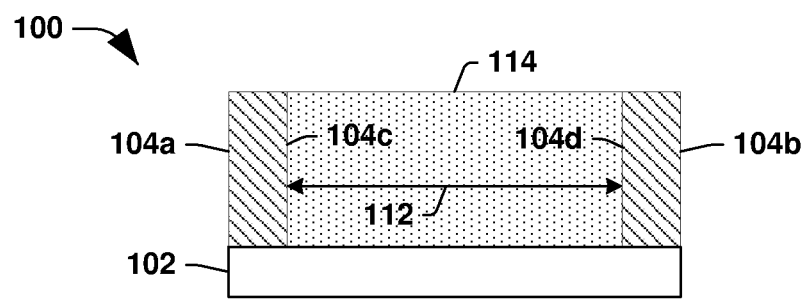

FIG. 7 illustrates a removal process whereby excess material of the first conductive layer 114 is removed, according to some embodiments. According to some embodiments, the removal process comprises at least one of chemical-mechanical polishing (CMP) or other suitable techniques. According to some embodiments, the excess material of the first conductive layer 114 is removed down to at least one of a top surface of the first portion 104a of the dielectric layer 104 or a top surface of the second portion 104b of the dielectric layer 104. In some embodiments, the removal process removes some of at least one of the first portion 104a of the dielectric layer 104 or the second portion 104b of the dielectric layer 104, in addition to the excess material of the first conductive layer 114. According to some embodiments, a top surface of the first conductive layer 114 is made relatively uniform via the removal process, such as by selection of chemicals, slurry, etc. used in a CMP process.

Figure 8:
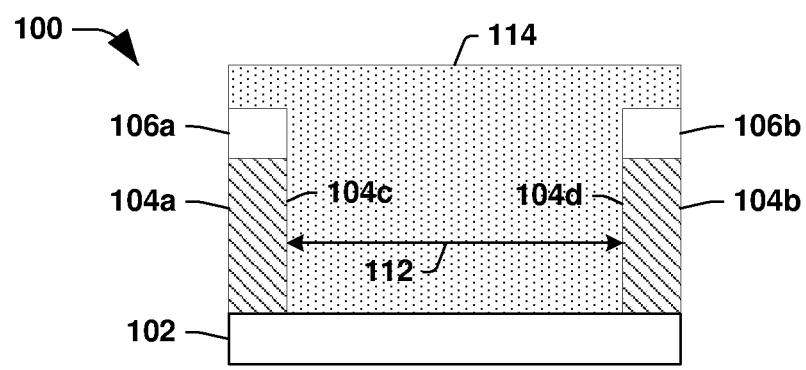

FIG. 8 illustrates the first conductive layer 114 formed in the recess 110 before removal of the first portion 106a of the photoresist and the second portion 106b of the photoresist, according to some embodiments. Accordingly, unlike the scenario described with respect to FIG. 6, the first conductive layer 114 is also formed over remaining portions of the photoresist 106, in some embodiments.

Figure 9:
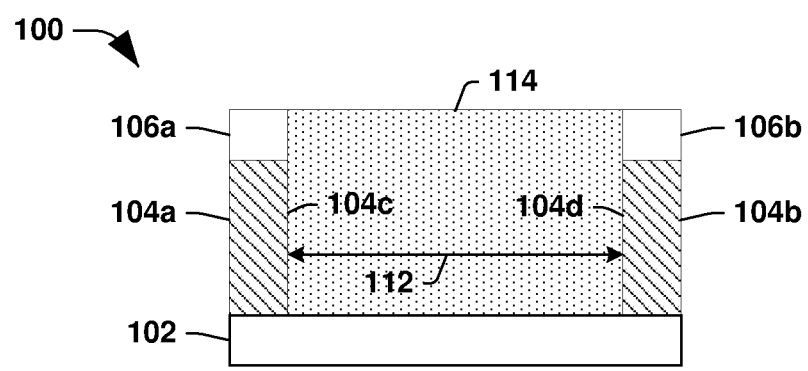

FIG. 9 illustrates removal of excess material of the first conductive layer 114 from remaining portions of the photoresist 106, according to some embodiments. According to some embodiments, the removal process comprises at least one of chemical-mechanical polishing (CMP) or other suitable techniques. According to some embodiments, the excess material of the first conductive layer 114 is removed down to at least one of a top surface of the first portion 106a of the photoresist or a top surface of the second portion 106b of the photoresist. In some embodiments, the removal process removes at least one of the first portion 106a of the photoresist or the second portion 106b of the photoresist such that the resulting structure corresponds to the structure illustrated in FIG. 7.

FIG. 10 illustrates removal of a portion of the first conductive layer 114 to form a recess 116 defined by the first sidewall 104c of the first portion 104a of the dielectric layer 104 and the second sidewall 104d of the second portion 104b of the dielectric layer 104, according to some embodiments. In some embodiments, an etching process is performed to form the recess 116. In some embodiments, a patterned photoresist (not shown) is used to remove the portion of the first conductive layer 114, where a first remaining portion of the patterned photoresist protects or shields the first portion 104a of the dielectric layer 104 from an etchant applied during the etching process and a second remaining portion of the patterned photoresist protects or shields the second portion 104b of the dielectric layer 104 from the etchant applied during the etching process. A portion of the first conductive layer 114 not covered by the patterned photoresist is exposed to the etchant and is removed or etched away during the etching process. In some of embodiments, the first conductive layer 114 is not etched all the way through such that some of the first conductive layer 114 remains between the first portion 104a of the dielectric layer 104 and the second portion 104b of the dielectric layer 104.

The recess 116 has a width 118 defined by a distance between the first sidewall 104c of the first portion 104a of the dielectric layer 104 and the second sidewall 104d of the second portion 104b of the dielectric layer 104, according to some embodiments. According to some embodiments, the width 118 is substantially constant, such as where the first sidewall 104c and the second sidewall 104d are substantially planar and parallel to one another. In some embodiments, the width 118 is equal to the width 112. With reference to FIG. 11, in some embodiments, the width 118 is greater than or less than the width 112. In some embodiments, the etching process removes at least some of at least one of the first portion 104a of the dielectric layer 104 or the second portion 104b of the dielectric layer 104 such that the width 118 is greater than the width 112. The recess 116 has a depth 119 defined by a distance between the top surface of the first conductive layer 114 and the top surface of the dielectric layer 104, according to some embodiments. According to some embodiments, the depth 119 is greater than 3 nm. In some embodiments, a ratio of the depth 119 to the width 118 of the recess 116 is between 0.25 and 7.5 indicating that the recess is sufficiently deep so that a feature formed in the recess 116 is seated in the recess and unlikely to easily dislodge from the recess 116. In some embodiments, a ratio of the depth 119 to the width 118 of the recess 116 is less than 7.5 indicating that the recess is sufficiently deep so that a feature formed in the recess 116 is seated in the recess and unlikely to easily dislodge from the recess 116. According to some embodiments, the depth 119 of the recess 116 being at least 3 nm at least one of inhibits the first conductive layer 114 from being affected by one or more subsequent processes, such as an etching process, inhibits intermixing of the first conductive layer 114 with one or more other layers, such as a third conductive layer 132 (FIG. 19) that overlies the first conductive layer 114, or promotes a relatively low resistance of at least one of the first conductive layer 114 or one or more layers formed in the recess 116 as compared to where the depth 119 of the recess 116 is not at least 3 nm. According to some embodiments, the etching process is a wet etching process. According to some embodiments, the etching process is a dry etching process. According to some embodiments, the etching process uses at least one of hydrogen chloride (HCl$_2$), hydrogen sulfide (H$_2$S), or other suitable materials. According to some embodiments, the top surface of the first conductive layer 114 is relatively uniform after the recess 110 is formed. In some embodiments, an etch selectivity of at least one of the first conductive layer 114, the dielectric layer 104, or the patterned photoresist relative to an etchant of the etching process yields the relatively uniform top surface of the first conductive layer 114. In some embodiments, a relatively uniform surface is substantially planar such that few to no portions of the surface do not lie within a same plane. In some embodiments, at least one of time, temperature, pressure, etchant(s) utilized, or other variables are controlled to control removal of the portion of the first conductive layer 114. In some embodiments, one or more variables are controlled to promote substantially vertical, as opposed to lateral, removal of the first conductive layer 114 so that at least one of the first sidewall 104c and the second sidewall 104d are substantially planar or the respective thicknesses of the first portion 104a of the dielectric layer 104 and the second portion 104b of the dielectric layer 104 experience little to no alteration when the portion of the first conductive layer 114 is removed. In some embodiments, one or more etchants remove the first conductive layer 114 at a substantially uniform rate such that as the thickness of the first conductive layer 114 is reduced between the first portion 104a and the second portion 104b the thickness of the first conductive layer 114 nevertheless remains substantially constant between the first portion 104a and the second portion 104b. In some embodiments, the thickness of the first conductive layer 114 is measured from the top surface of the support medium 102 to the top surface of the first conductive layer 114. In some embodiments, the thickness of the first conductive layer 114 is measured from a bottom surface of the first conductive layer 114 to the top surface of the first conductive layer 114. In some embodiments, one or more variables are controlled to promote the substantially uniform removal rate of the first conductive layer 114, and thereby yield the relatively uniform top surface of the first conductive layer 114 as compared to scenarios where such variables are not so controlled.

FIG. 12 illustrates a second conductive layer 120 formed in the recess 116 and over the first sidewall 104c and the second sidewall 104d, according to some embodiments. In some embodiments, the second conductive layer 120 comprises a metal material for the conduction of electricity. According to some embodiments, the second conductive layer 120 comprises metal. According to some embodiments, the second conductive layer 120 is electrically conductive. According to some embodiments, the second conductive layer 120 comprises metal but has little to no electrical conductivity. According to some embodiments, the second conductive layer 120 comprises at least one of cobalt, tungsten, carbide, titanium (Ti), titanium nitride (TiN), tantalum (Ta), tantalum nitride (TaN), or other suitable materials. In some embodiments, the second conductive layer 120 and the first conductive layer 114 are comprised of different materials or have different material compositions. In some embodiments, the second conductive layer 120 and the first conductive layer 114 are comprised of different materials or have different material compositions so as to have a different etch selectivity to an etchant. According to some embodiments, a different etch selectivity results in an etchant used to etch the second conductive layer 120 having little to no effect on the first conductive layer 114. In some embodiments, the second conductive layer 120 and the first conductive layer 114 are comprised of different materials or have different material compositions so that the first conductive layer 114 adheres well to the support medium 102 while the second conductive layer 120 has a desired electrical conductivity. In some embodiments, the second conductive layer 120 and the first conductive layer 114 are comprised of a same material or have a same material composition. In some embodiments, the second conductive layer 120 and the first conductive layer 114 are comprised of a same material or have a same material composition to strike a balance between adhesion to the support medium 102 and desired electrical conductivity. In some embodiments, the material of the second conductive layer 120 and the first conductive layer 114 adheres well to the support medium 102 but has some resistance. In some embodiments, the material of the second conductive layer 120 and the first conductive layer 114 adheres somewhat well to the support medium 102 but has relatively low resistance. In some embodiments, where the second conductive layer 120 and the first conductive layer 114 are comprised of a same material or have a same material composition multiple etching operations are not required such that a single operation is performed to fill the recess 110 and recess 116 is not formed. In some embodiments, the second conductive layer 120 is in contact with the first conductive layer 114. In some embodiments, the second conductive layer 120 is formed by at least one of physical vapor deposition (PVD), sputtering, chemical vapor deposition (CVD), low pressure CVD (LPCVD), atomic layer deposition (ALD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), spin coating, oxidation, or other suitable techniques.

In some embodiments, forming the second conductive layer 120 comprises forming a seed layer (not shown) over at least one of the first sidewall 104c, the second sidewall 104d, or a top surface of a feature that defines a bottom of the recess 116, such as a top surface of the first conductive layer 114. In some embodiments, the seed layer comprises at least one of copper, titanium, or other suitable materials. In some embodiments, the seed layer facilitates growing the second conductive layer 120 in the recess 116. In some embodiments, forming the second conductive layer 120 comprises using selective metal growth. According to some embodiments, forming the second conductive layer 120 using selective metal growth promotes a relatively low resistance of the second conductive layer 120 as compared to where the second conductive layer 120 is formed using other than selective metal growth.

Figure 13:
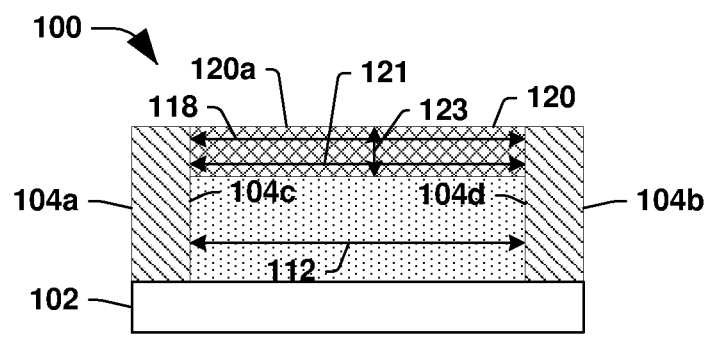

FIG. 13 illustrates a removal process whereby excess material of the second conductive layer 120 is removed, according to some embodiments. According to some embodiments, the removal process comprises at least one of chemical-mechanical polishing (CMP) or other suitable techniques. According to some embodiments, the excess material of the second conductive layer 120 is removed down to at least one of a top surface of the first portion 104a of the dielectric layer 104 or a top surface of the second portion 104b of the dielectric layer 104. In some embodiments, the removal process removes some of at least one of the first portion 104a of the dielectric layer 104 or the second portion 104b of the dielectric layer 104, in addition to the excess material of the second conductive layer 120. According to some embodiments, a top surface of the second conductive layer 120 is made relatively uniform via the removal process, such as by selection of chemicals, slurry, etc. used in a CMP process.

In some embodiments, the second conductive layer 120 serves as a metal cap 120a for the first conductive layer 114. In some embodiments, the second conductive layer 120 serves as a contact that facilitates electrical connection to one or more conductive layers at least one of above or below the second conductive layer 120. The second conductive layer 120 has a width 121. In some embodiments, the width 121 corresponds to the width 118. The second conductive layer 120 has a thickness 123. In some embodiments, the thickness 123 corresponds to the depth 119 illustrated in FIG. 10. According to some embodiments, the thickness 123 is greater than 3 nm. In some embodiments, a ratio of the thickness 123 to the width 121 of the metal cap 120a is between 0.25 and 7.5 indicating that at least one of the metal cap 120a seats well within recess 116 and is unlikely to easily dislodge from the recess 116 or an uppermost surface of the metal cap 120a provides a sufficient surface area for an overlying feature to contact the metal cap 120a. In some embodiments, a ratio of the thickness 123 to the width 121 of the metal cap 120a is less than 7.5 indicating that at least one of the metal cap 120a seats well within recess 116 and is unlikely to easily dislodge from the recess 116 or an uppermost surface of the metal cap 120a provides a sufficient surface area for an overlying feature to contact the metal cap 120a.

Figure 14:
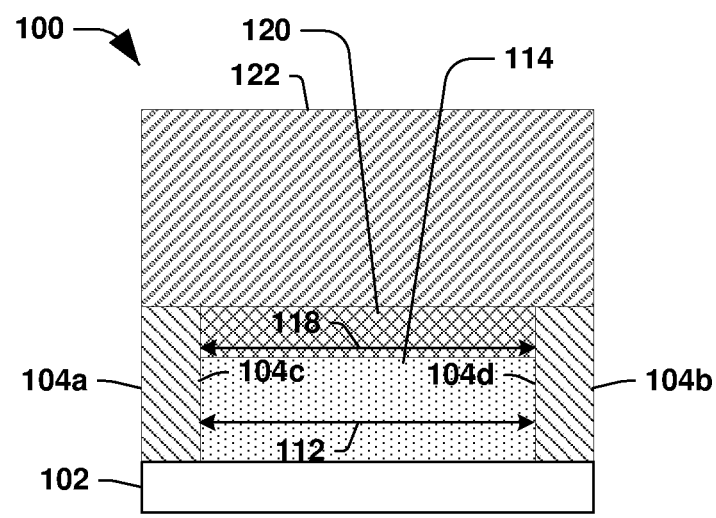

FIG. 14 illustrates a dielectric layer 122 formed over at least one of the second conductive layer 120, the first portion 104a of the dielectric layer 104, or the second portion 104b of the dielectric layer 104, according to some embodiments. In some embodiments, the dielectric layer 104 is in contact with at least one of a top surface of the second conductive layer 120, a top surface of the first portion 104a of the dielectric layer 104, or a top surface of the second portion 104b of the dielectric layer 104. In some embodiments, the dielectric layer 122 comprises at least one of a polymer, an oxide, polybenzobisoxazole (PBO), a polyimide (PI), a metal nitride, silicon, germanium, carbide, gallium, arsenide, germanium, arsenic, indium, silicon oxide, sapphire, a buried oxide (BOX) layer, a high-k dielectric constant material, a rare earth oxide, an aluminate of a rare earth oxide, a silicate of a rare earth oxide, an epitaxial layer, a SOI structure, a wafer, a die formed from a wafer, a doped epitaxial layer, a semiconductor layer, a gradient semiconductor layer, a plurality of semiconductor layers, a plurality of semiconductor layers where one or more of the semiconductor layers are of a different type than another layer of the plurality of semiconductor layers, or other suitable materials. In some embodiments, the dielectric layer 104 and the dielectric layer 122 are comprised of a same material or have a same material composition. In some embodiments, the dielectric layer 104 and the dielectric layer 122 are comprised of different materials or have different material compositions. In some embodiments, the dielectric layer 104 is formed by at least one of physical vapor deposition (PVD), sputtering, chemical vapor deposition (CVD), low pressure CVD (LPCVD), atomic layer deposition (ALD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), spin coating, oxidation, or other suitable techniques.

Figure 15:
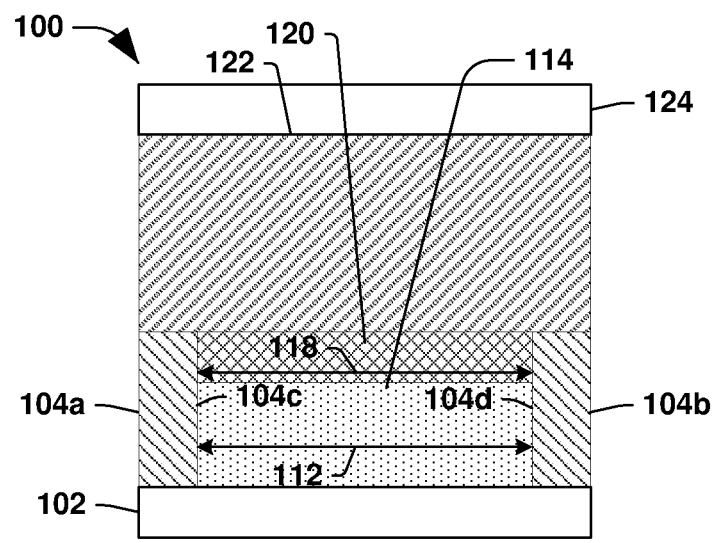

FIG. 15 illustrates a photoresist 124 formed over the dielectric layer 122, according to some embodiments. In some embodiments, the photoresist 124 is formed by at least one of spinning, spray coating, or other applicable processes.

Figure 16:
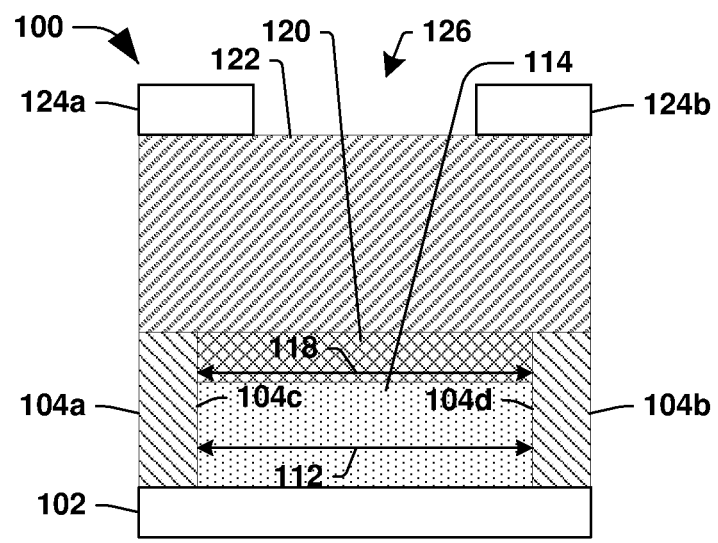

FIG. 16 illustrates the photoresist 124 patterned to have an opening 126 defined by a sidewall of a first portion 124a of the photoresist and a sidewall of a second portion 124b of the photoresist, according to some embodiments. In some embodiments, the photoresist 106 comprises a light-sensitive material, as described above with regard to FIG. 3.

Figure 17:
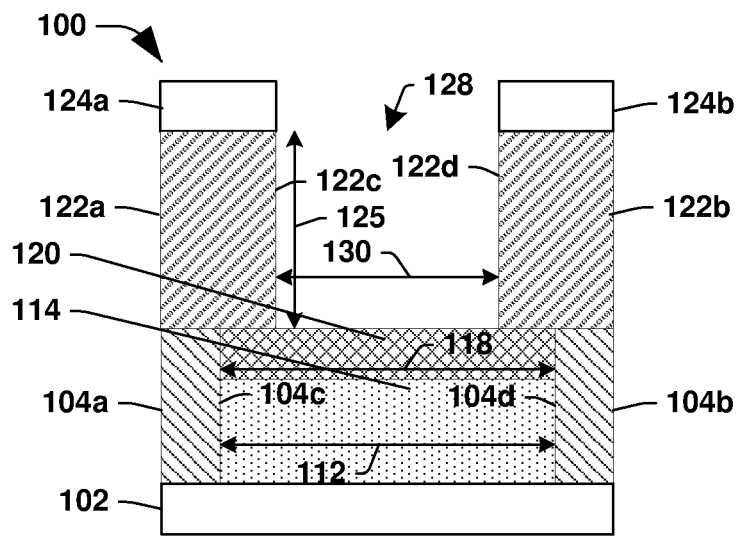

FIG. 17 illustrates use of the patterned photoresist 124 in removing a portion of the dielectric layer 122 to form a recess 128 defined by a first sidewall 122c of a first portion 122a of the dielectric layer 122 and a second sidewall 122d of a second portion 122b of the dielectric layer 122, according to some embodiments. In some embodiments, an etching process is performed to form the recess 128, where the first portion 124a of the photoresist 124 protects or shields the first portion 122a of the dielectric layer 122 from an etchant applied during the etching process and the second portion 124b of the photoresist 124 protects or shields the second portion 122b of the dielectric layer 122 from the etchant applied during the etching process. A portion of the dielectric layer 122 not covered by the photoresist 124 is exposed to the etchant and is removed or etched away during the etching process to expose a portion of the second conductive layer 120.

The recess 128 has a width 130 defined by a distance between the first sidewall 122c of the first portion 122a of the dielectric layer 122 and the second sidewall 122d of the second portion 122b of the dielectric layer 122, according to some embodiments. According to some embodiments, the width 130 is substantially constant, such as where the first sidewall 122c and the second sidewall 122d are substantially planar and parallel to one another. In some embodiments, the width 130 is less than the width 112. In some embodiments, the width 130 is less than the width 118. The recess 128 has a depth 125 defined by a distance between the top surface of the second conductive layer 120 and the top surface of the dielectric layer 122, according to some embodiments. According to some embodiments, the depth 125 is greater than the width 130. In some embodiments, a ratio of the depth 125 to the width 130 of the recess 128 is between 0.25 and 10 indicating that the recess is sufficiently deep so that a feature formed in the recess 110 is seated in the recess and unlikely to easily dislodge from the recess 128. According to some embodiments, the etching process is a wet etching process. According to some embodiments, the etching process is a dry etching process. According to some embodiments, the etching process uses at least one of hydrogen chloride ($HCl_2$), hydrogen sulfide ($H_2S$), or other suitable materials. According to some embodiments, the top surface of the second conductive layer 120 is relatively uniform after the recess 128 is formed. In some embodiments, an etch selectivity of at least one of the second conductive layer 120, the dielectric layer 122, or the photoresist 124 relative to an etchant of the etching process yields the relatively uniform top surface of the second conductive layer 120. In some embodiments, a relatively uniform surface is substantially planar such that few to no portions of the surface do not lie within a same plane. In some embodiments, at least one of time, temperature, pressure, etchant(s) utilized, or other variables are controlled to control removal of the portion of the dielectric layer 122. In some embodiments, one or more variables are controlled to promote substantially vertical, as opposed to lateral, removal of the dielectric layer 122 so that at least one of the first sidewall 122c and the second sidewall 122d are substantially planar or the respective thicknesses of the first portion 122a of the dielectric layer 122 and the second portion 122b of the dielectric layer 122 experience little to no alteration when the portion of the dielectric layer 122 is removed. In some embodiments, one or more etchants remove the dielectric layer 122 at a substantially uniform rate such that as the thickness of the dielectric layer 122 is reduced between the first portion 122a and the second portion 122b the thickness of the dielectric layer 122 nevertheless remains substantially constant between the first portion 122a and the second portion 122b. In some embodiments, the thickness of the dielectric layer 122 is measured from the top surface of the second conductive layer 120 to the top surface of the dielectric layer. In some embodiments, the thickness of the dielectric layer 122 is measured from a bottom surface of the dielectric layer 122 to the top surface of the dielectric layer 122. In some embodiments, given a substantially uniform removal rate of the dielectric layer 122, generally no portion of the top surface of the second conductive layer 120 is exposed before any other portion of the top surface of the second conductive layer 120 is exposed. In some embodiments, substantially uniform exposure of the top surface of the second conductive layer 120 yields the relatively uniform top surface of the second conductive layer 120 at least because no portion of the top surface of the second conductive layer 120 is exposed to an etchant longer than any other portion of the top surface of the second conductive layer 120. In some embodiments, one or more variables are controlled to promote the substantially uniform removal rate of the dielectric layer 122, and thereby yield the relatively uniform top surface of the second conductive layer 120 as compared to scenarios where such variables are not so controlled.

Figure 18:
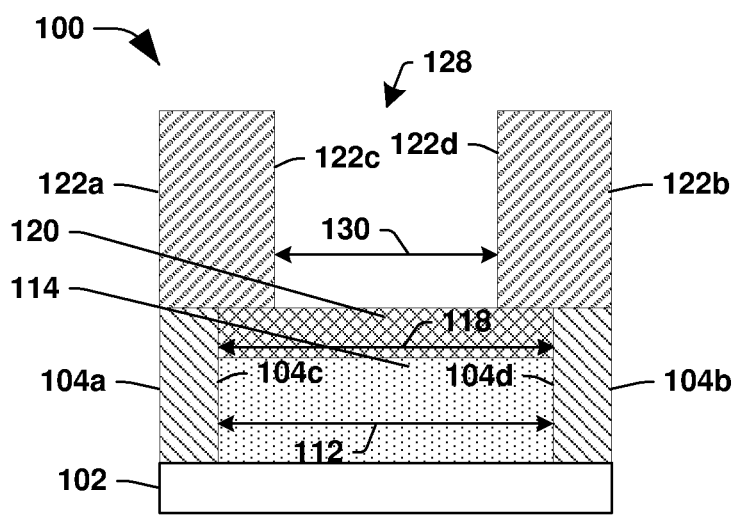

FIG. 18 illustrates the first portion 124a of the photoresist and the second portion 124b of the photoresist washed away, stripped, or otherwise removed, according to some embodiments.

Figure 19:
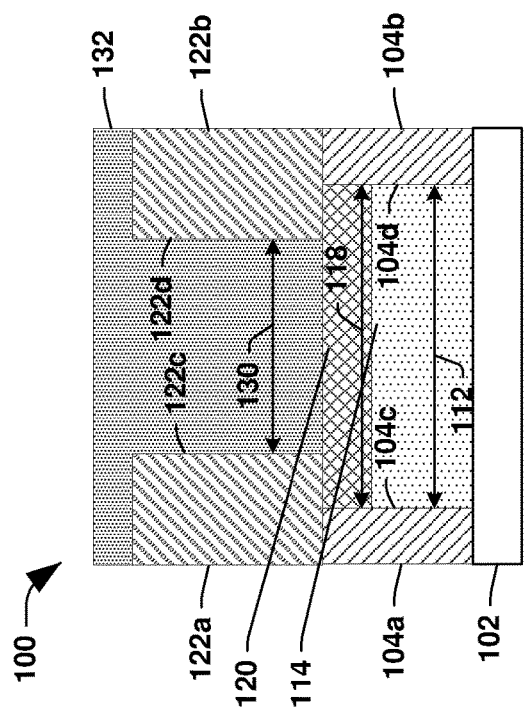

FIG. 19 illustrates a third conductive layer 132 formed in the recess 128 and over the first sidewall 122c and the second sidewall 122d, according to some embodiments. In some embodiments, the third conductive layer 132 comprises a metal material for the conduction of electricity. According to some embodiments, the third conductive layer 132 comprises metal. According to some embodiments, the third conductive layer 132 is electrically conductive. According to some embodiments, the third conductive layer 132 comprises metal but has little to no electrical conductivity. According to some embodiments, the third conductive layer 132 comprises at least one of cobalt, tungsten, carbide, titanium (Ti), titanium nitride (TiN), tantalum (Ta), tantalum nitride (TaN), or other suitable materials. In some embodiments, the third conductive layer 132 and the first conductive layer 114 are comprised of different materials or have different material compositions. In some embodiments, the third conductive layer 132 and the first conductive layer 114 are comprised of a same material or have a same material composition. In some embodiments, the third conductive layer 132 and the second conductive layer 120 are comprised of different materials or have different material compositions. In some embodiments, the third conductive layer 132 and the second conductive layer 120 are comprised of a same material or have a same material composition. In some embodiments, the third conductive layer 132 is in contact with the second conductive layer 120. In some embodiments, the third conductive layer 132 is formed by at least one of physical vapor deposition (PVD), sputtering, chemical vapor deposition (CVD), low pressure CVD (LPCVD), atomic layer deposition (ALD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), spin coating, oxidation, or other suitable techniques.

In some embodiments, forming the third conductive layer 132 comprises forming a seed layer (not shown) over at least one of the first sidewall 122c, the second sidewall 122d, or a top surface of a feature that defines a bottom of the recess 116, such as a top surface of the second conductive layer 120. In some embodiments, the seed layer comprises at least one of copper, titanium, or other suitable materials. In some embodiments, the seed layer facilitates growing the third conductive layer 132 in the recess 128. In some embodiments, forming the third conductive layer 132 comprises using selective metal growth. According to some embodiments, forming the third conductive layer 132 using selective metal growth promotes a relatively low resistance of the third conductive layer 132 as compared to where the third conductive layer 132 is formed using other than selective metal growth.

Figure 20:
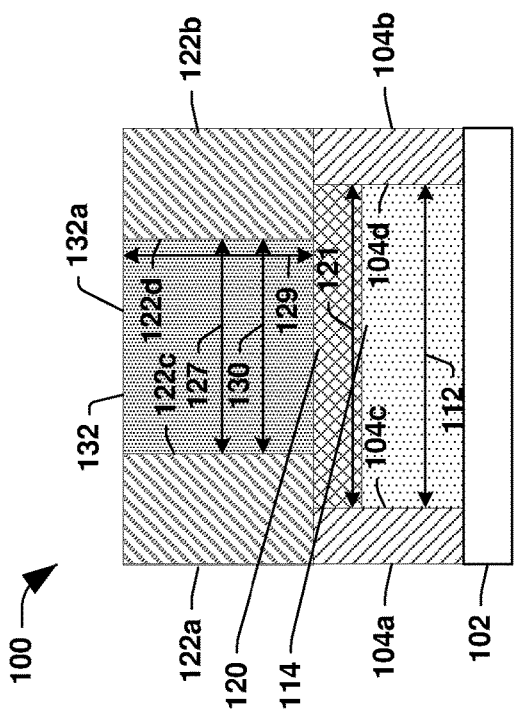

FIG. 20 illustrates a removal process whereby excess material of the third conductive layer 132 is removed, according to some embodiments. According to some embodiments, the removal process comprises at least one of chemical-mechanical polishing (CMP) or other suitable techniques. According to some embodiments, the excess material of the third conductive layer 132 is removed down to at least one of a top surface of the first portion 122a of the dielectric layer 122 or a top surface of the second portion 122b of the dielectric layer 122. In some embodiments, the removal process removes some of at least one of the first portion 122a of the dielectric layer 122 or the second portion 122b of the dielectric layer 122, in addition to the excess material of the third conductive layer 132. According to some embodiments, a top surface of the third conductive layer 132 is made relatively uniform via the removal process, such as by selection of chemicals, slurry, etc. used in a CMP process.

Figure 21:
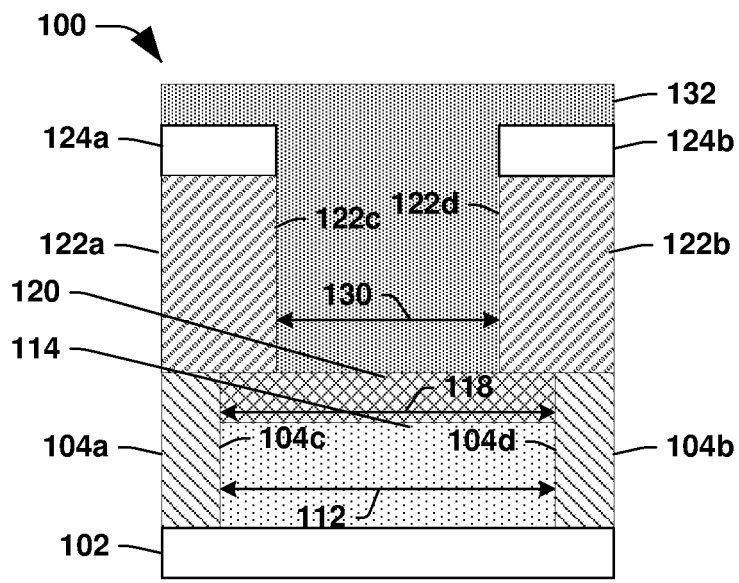

FIG. 21 illustrates the third conductive layer 132 formed in the recess 128 before removal of the first portion 124a of the photoresist and the second portion 124b of the photoresist, according to some embodiments. Accordingly, unlike the scenario described with respect to FIG. 19, the third conductive layer 132 is also formed over remaining portions of the photoresist 124, in some embodiments.

Figure 22:
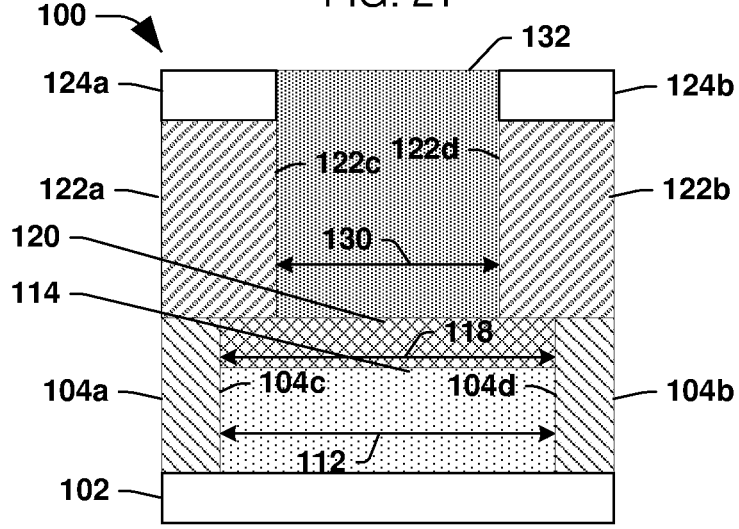

FIG. 22 illustrates removal of excess material of the third conductive layer 132 from remaining portions of the photoresist 124, according to some embodiments. According to some embodiments, the removal process comprises at least one of chemical-mechanical polishing (CMP) or other suitable techniques. According to some embodiments, the excess material of the third conductive layer 132 is removed down to at least one of a top surface of the first portion 124a of the photoresist or a top surface of the second portion 124b of the photoresist. In some embodiments, the removal process removes at least one of the first portion 124a of the photoresist or the second portion 124b of the photoresist such that the resulting structure corresponds to the structure illustrated in FIG. 20.

In some embodiments, the third conductive layer 132 serves as a metal contact 132a that facilitates electrical connection to one or more conductive layers at least one of above or below the third conductive layer 132. The third conductive layer 132 has a width 127. In some embodiments, the width 127 corresponds to the width 130. The second conductive layer 120 has a thickness 129. In some embodiments, the thickness 129 corresponds to the depth 125 illustrated in FIG. 17. In some embodiments, a ratio of the thickness 129 to the width 127 of the metal contact 132a is between 0.25 and 10. According to some embodiments, the metal contact 132a seats well within recess 128 and is unlikely to easily dislodge from the recess 128. In some embodiments, the width 127 of the metal contact 132a is less than the width 121 of the metal cap 120a. In some embodiments, the greater width 127 of the metal contact 132a relative to the width 121 of the metal cap 120a inhibits damage, such as chemical damage, from a pathway between a pathway along a sidewall of the metal contact 132a, such as by blocking furtherance of such a pathway along the sidewall of the metal contact 132a. According to some embodiments, implementing the metal cap 120a provides for cost reduction in forming the metal contact 132a as multiple metal contacts 132a are concurrently formed on different substrates, such as over different metal caps 120a. In some embodiments, a variety of metal caps 120a have a variety of material compositions and a variety of metal contacts 132a have a variety of material compositions. In some embodiments, one or more metal contacts 132a have different material compositions while one or metal caps 120a have a same material composition. In some embodiments, one or more metal contacts 132a have a same material compositions while one or metal caps 120a have different material compositions. In some embodiments, one or more metal contacts 132a have different material compositions and one or metal caps 120a have different material composition. In some embodiments, one or more metal contacts 132a have a same material composition while one or metal caps 120a have a same material composition.

Figure 23:
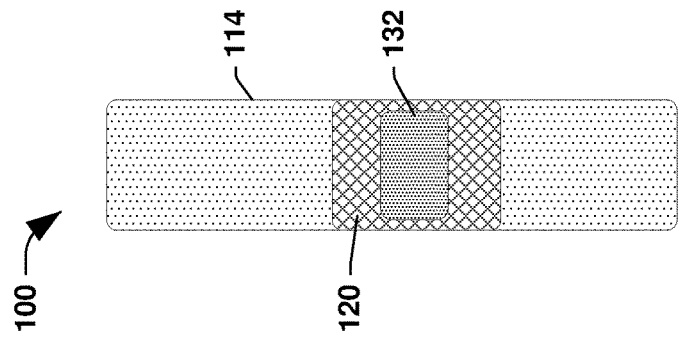
FIG. 23 illustrates a top-down view of a semiconductor arrangement at a stage of fabrication, in accordance with some embodiments.

FIG. 23 illustrates a top down view of the third conductive layer 132, the second conductive layer 120, and the first conductive layer 114 of the semiconductor arrangement 100, according to some embodiments. According to some embodiments, the area of the second conductive layer 120 is greater than the area of the third conductive layer 132. In some embodiments, the third conductive layer 132 is dimensioned relative to the second conductive layer 120 such that none of the third conductive layer 132 extends past or overhangs any of the second conductive layer 120. In some embodiments, the second conductive layer 120 is dimensioned relative to the first conductive layer 114 such that none of the second conductive layer 120 extends past or overhangs any of the first conductive layer 114. In some embodiments, the second conductive layer 120 is dimensioned relative to the first conductive layer 114 such some of the second conductive layer 120 extends past or overhangs any of the first conductive layer 114. In some embodiments, the second conductive layer 120 is dimensioned relative to the first conductive layer 114 such that some of the second conductive layer 120 extends past or overhangs any of the first conductive layer 114 while the third conductive layer 132 is dimensioned relative to the second conductive layer 120 such that none of the third conductive layer 132 extends past or overhangs any of the second conductive layer 120. In some embodiments, the first conductive layer 114 serves as a S/D contact in a FinFET structure and the metal contact 132a serves as a contact via in the FinFET structure. In some embodiments, the support medium 102 corresponds to a S/D region of a FinFET structure such that the semiconductor arrangement 100 provides a mechanism for electrically coupling to the S/D region of the FinFET structure. In some embodiments, the support medium 102 corresponds to a S/D region of a MOS transistor such that the semiconductor arrangement 100 provides a mechanism for electrically coupling to the S/D region of the MOS transistor. In some embodiments, the support medium 102 corresponds to a gate of a FinFET structure such that the semiconductor arrangement 100 provides a mechanism for electrically coupling to the gate of the FinFET structure. In some embodiments, the support medium 102 corresponds to a gate of a MOS transistor such that the semiconductor arrangement 100 provides a mechanism for electrically coupling to the gate of the MOS transistor. In some embodiments, various instances of the semiconductor arrangement are respectively coupled to various conductive regions, such as S/D regions, gates, wells, etc., to provide respective mechanisms for electrically coupling to the various conductive regions.

According to some embodiments, the semiconductor arrangement has at least one of a lower resistance, a lower capacitance, or a lower RC delay at least with respect to the interface between the support medium and the first conductive layer, the interface between the first conductive layer and the second conductive layer, or the interface between the second conductive layer and the third conductive layer, as compared to interfaces that are less uniform.

According to some embodiments, a method for fabricating a semiconductor arrangement includes removing a portion of a first dielectric layer to form a first recess defined by a first sidewall of the first dielectric layer and a second sidewall of the first dielectric layer and forming a first conductive layer in the first recess. The method also includes removing a portion of the first conductive layer to form a second recess defined by the first sidewall of the first dielectric layer and the second sidewall of the first dielectric layer and forming a second conductive layer in the second recess, where the second conductive layer is in contact with the first conductive layer. The method also includes forming a second dielectric layer over the second conductive layer and removing a portion of the second dielectric layer to form a third recess defined by a first sidewall of the second dielectric layer and a second sidewall of the second dielectric layer, where the second conductive layer is exposed through the third recess. The method also includes forming a third conductive layer in the third recess, where the third conductive layer is in contact with the second conductive layer.

In some embodiments, the first conductive layer is made of cobalt. In some embodiments, the second conductive layer is made of tungsten. In some embodiments, the second dielectric layer overlies the second conductive layer. In some embodiments, the second dielectric layer is in contact with the first dielectric layer to define an interface. In some embodiments, the at least one of removing the portion of a first dielectric layer, removing the portion of the first conductive layer, or removing the portion of the second dielectric layer includes performing an etching process. In some embodiments, performing the etching process includes employing a chemical etchant. In some embodiments, the first conductive layer has a first width, the second conductive layer has a second width, and the third conductive layer has a third width less than at least one of the first width or the second width. In some embodiments, the first conductive layer and the second conductive layer are made of different materials.

According to some embodiments, a semiconductor structure includes a first conductive layer between a first sidewall of a first dielectric layer and a second sidewall of the first dielectric layer, where the first conductive layer has a first width. The semiconductor structure also includes a second conductive layer between the first sidewall of the first dielectric layer and the second sidewall of the first dielectric layer and in contact with the first conductive layer, where the second conductive layer has a second width. The semiconductor structure also includes a third conductive layer in contact with the second conductive layer and between a first sidewall of a second dielectric layer and a second sidewall of the second dielectric layer, where the third conductive layer has a third width less than at least one of the first width or the second width.

In some embodiments, the first conductive layer is in contact with the first sidewall of the first dielectric layer and the second sidewall of the first dielectric layer. In some embodiments, the second conductive layer is in contact with the first sidewall of the first dielectric layer and the second sidewall of the first dielectric layer. In some embodiments, the second dielectric layer is in contact with the second conductive layer. In some embodiments, the second width is equal to the first width. In some embodiments, the third conductive layer is in contact with the first sidewall of the second dielectric layer and the second sidewall of the second dielectric layer.

According to some embodiments, a method for fabricating a semiconductor arrangement includes forming a first conductive layer to have a first material composition and a first width and forming a second conductive layer to have a second material composition and a second width, where the second conductive layer is over and in contact with the first conductive layer and the second material composition is different than the first material composition. The method also includes forming a third conductive layer to have a third material composition and a third width, where the third conductive layer is over and in contact with the second conductive layer and the third width is less than at least one of the first width or the second width.

In some embodiments, forming the first conductive layer comprises forming the first conductive layer in a first recess defined by a first sidewall of a first dielectric layer and a second sidewall of the first dielectric layer and forming the second conductive layer comprises forming the second conductive layer in a second recess defined by the first sidewall of the first dielectric layer and the second sidewall of the first dielectric layer. In some embodiments, forming the third conductive layer comprises forming the third conductive layer in a third recess defined by a first sidewall of a second dielectric layer and a second sidewall of the second dielectric layer. In some embodiments, a bottom surface of the second dielectric layer is in contact with a top surface of the second dielectric layer. In some embodiments, a bottom surface of the second dielectric layer is in contact with a top surface of the second conductive layer.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising".

Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for fabricating a semiconductor arrangement, comprising:
    removing a portion of a first dielectric layer to form a first recess defined by a first sidewall of the first dielectric layer and a second sidewall of the first dielectric layer;
    forming a first conductive layer in the first recess;
    removing a portion of the first conductive layer to expose the first sidewall of the first dielectric layer and the second sidewall of the first dielectric layer and to form a second recess defined by the first sidewall of the first dielectric layer and the second sidewall of the first dielectric layer;
    forming a second conductive layer in the second recess, wherein the second conductive layer is in contact with the first conductive layer;
    forming a second dielectric layer over the second conductive layer;
    removing a portion of the second dielectric layer to form a third recess defined by a first sidewall of the second dielectric layer and a second sidewall of the second dielectric layer, wherein the second conductive layer is exposed through the third recess; and
    forming a third conductive layer in the third recess, wherein the third conductive layer is in contact with the second conductive layer.

2. The method of claim 1, wherein the first conductive layer comprises cobalt.

3. The method of claim 1, wherein the second conductive layer comprises tungsten.

4. The method of claim 1, wherein the second dielectric layer overlies the second conductive layer.

5. The method of claim 1, wherein the second dielectric layer is in contact with the first dielectric layer to define an interface.

6. The method of claim 1, wherein at least one of removing the portion of the first dielectric layer, removing the portion of the first conductive layer, or removing the portion of the second dielectric layer comprises performing an etching process.

7. The method of claim 6, wherein performing the etching process comprises employing a chemical etchant.

8. The method of claim 1, wherein the first conductive layer has a first width, the second conductive layer has a second width, and the third conductive layer has a third width less than at least one of the first width or the second width.

9. The method of claim 1, wherein the first conductive layer and the second conductive layer are comprised of different materials.

10. A method for fabricating a semiconductor arrangement, comprising:
- forming a first conductive layer to have a first material composition and a first cross-sectional area, wherein forming the first conductive layer comprises forming the first conductive layer in a first recess defined by a first sidewall of a first dielectric layer and a second sidewall of the first dielectric layer;
- forming a second conductive layer to have a second material composition and a second cross-sectional area, wherein:
  - forming the second conductive layer comprises forming the second conductive layer in a second recess defined by the first sidewall of the first dielectric layer and the second sidewall of the first dielectric layer,
  - the second conductive layer is over the first conductive layer in a first direction,
  - the second conductive layer is in contact with the first conductive layer, and
  - the second material composition is different than the first material composition; and
- forming a third conductive layer to have a third material composition and a third cross-sectional area, wherein:
  - the third conductive layer is over the second conductive layer in the first direction,
  - the third conductive layer is in contact with the second conductive layer,
  - the third cross-sectional area is less than at least one of the first cross-sectional area or the second cross-sectional area, and
  - the first cross-sectional area, the second cross-sectional area, and the third cross-sectional area correspond to cross-sections perpendicular to the first direction.

11. The method of claim 10, wherein forming the third conductive layer comprises forming the third conductive layer in a third recess defined by a first sidewall of a second dielectric layer and a second sidewall of the second dielectric layer.

12. The method of claim 11, wherein a bottom surface of the second dielectric layer is in contact with a top surface of the first dielectric layer.

13. The method of claim 11, wherein a bottom surface of the second dielectric layer is in contact with a top surface of the second conductive layer.

14. The method of claim 10, wherein the third cross-sectional area is less than the first cross-sectional area and the second cross-sectional area.

15. The method of claim 14, wherein the second cross-sectional area is less than the first cross-sectional area.

16. The method of claim 10, wherein the second cross-sectional area is less than the first cross-sectional area.

17. A method for fabricating a semiconductor arrangement, comprising:
- removing a portion of a first dielectric layer to form a first recess defined by a first sidewall of the first dielectric layer and a second sidewall of the first dielectric layer;
- forming a first conductive layer in the first recess;
- removing a portion of the first conductive layer to form a second recess defined by the first sidewall of the first dielectric layer and the second sidewall of the first dielectric layer;
- forming a second conductive layer in the second recess, wherein the second conductive layer is in contact with the first conductive layer;
- forming a second dielectric layer over the second conductive layer, wherein the second dielectric layer is in contact with the first dielectric layer to define an interface;
- removing a portion of the second dielectric layer to form a third recess defined by a first sidewall of the second dielectric layer and a second sidewall of the second dielectric layer, wherein the second conductive layer is exposed through the third recess; and
- forming a third conductive layer in the third recess, wherein the third conductive layer is in contact with the second conductive layer.

18. The method of claim 17, wherein a width of the third recess is less than a width of the second conductive layer.

19. The method of claim 17, wherein the second dielectric layer continues to contact a top surface of the second conductive layer after the third recess is formed.

20. The method of claim 17, wherein the first conductive layer and the second conductive layer are comprised of different materials.

* * * * *